United States Patent [19]

Schouwenaars et al.

[11] Patent Number: 4,859,930
[45] Date of Patent: Aug. 22, 1989

[54] CURRENT SOURCE ARRANGEMENT

[76] Inventors: Hendrikus J. Schouwenaars; Eise C. Dijkmans; Dirk W. J. Groeneveld, all of Groenewoudseweg 1, Eindhoven, Netherlands

[21] Appl. No.: 193,376

[22] Filed: May 12, 1988

[30] Foreign Application Priority Data

Feb. 16, 1988 [NL] Netherlands .......................... 8800371

[51] Int. Cl.$^4$ ................................................ G05F 3/16
[52] U.S. Cl. ..................... 323/317; 341/133
[58] Field of Search ............... 323/272, 281, 312, 313, 323/314, 317; 341/133, 144, 153

[56] References Cited

U.S. PATENT DOCUMENTS 3,995,304 11/1976 Pease ...................................... 357/36
4,125,803 11/1978 van de Plassche .................. 323/317
4,482,887 11/1984 Crauwels ............................ 341/133
4,658,240 4/1987 Bixby .................................... 341/133
4,712,091 12/1987 Schoofs et al. ................. 323/312 X Primary Examiner—Patrick R. Salce
Assistant Examiner—Kristine Peckman
Attorney, Agent, or Firm—Bernard Franzblau

[57] ABSTRACT

A high accuracy current source arrangement is made up of a number of binary-weighted current sources each of which comprises a plurality of indentical transistors which are arranged regularly in a matrix of transistor elements on the surface area of an integrated circuit. The matrix of transistors is distributed over the area of the IC to provide the maximum spacing between the matrix elements (transistors) of each respective current source thereby to minimize the influence of variations in IC parameters or the like on the accuracy of the relationship of the binary-weighted currents to one another.

3 Claims, 3 Drawing Sheets

| | | | | | | | |
|---|---|---|---|---|---|---|---|
| A | B | A | C | A | B | A | R R S S' |
| C | A | B | A | F | A | B | A |
| A | G | A | B | A | C | A | B |
| B | A | C | A | B | A | D | A |
| A | B | A | D | A | B | A | C |
| D | A | B | A | C | A | B | A |
| A | C | A | B | A | E | A | B |
| B | A | E | A | B | A | C | A |
| A | B | A | C | A | B | A | D |
| C | A | B | A | D | A | B | A |
| A | D | A | B | A | C | A | B |
| B | A | C | A | B | A | F | A |
| A | B | A | H | A | B | A | C |
| F | A | B | A | C | A | B | A |
| A | C | A | B | A | D | A | B |
| B | A | D | A | B | A | C | A |
| A | B | A | C | A | B | A | E |
| C | A | B | A | E | A | B | A |
| A | E | A | B | A | C | A | B |
| B | A | C | A | B | A | D | A |
| A | B | A | D | A | B | A | C |
| D | A | B | A | C | A | B | A |
| A | C | A | B | A | G | A | B |
| B | A | F | A | B | A | C | A |
| A | B | A | C | A | B | A | D |
| C | A | B | A | D | A | B | A |
| A | D | A | B | A | C | A | B |
| B | A | C | A | B | A | E | A |
| A | B | A | E | A | B | A | C |
| E | A | B | A | C | A | B | A |
| A | C | A | B | A | D | A | B |
| B | A | D | A | B | A | C | A |

FIG. 3

| 1 | A | B | A | C | A | B | A | F |
|---|---|---|---|---|---|---|---|---|
|  | C | A | B | A | E | A | B | A |
|  | A | E | A | B | A | C | A | B |
|  | B | A | C | A | B | A | D | A |
| 5 | A | B | A | D | A | B | A | C |
|  | D | A | B | A | C | A | B | A |
|  | A | C | A | B | A | G | A | B |
|  | B | A | F | A | B | A | C | A |
|  | A | B | A | C | A | B | A | D |
| 10 | C | A | B | A | D | A | B | A |
|  | A | D | A | B | A | C | A | B |
|  | B | A | C | A | B | A | C | A |
|  | A | B | A | E | A | B | A | C |
|  | B | A | B | A | C | A | B | A |
| 15 | A | C | A | B | A | D | A | B |
|  | S' S R R | H | D | A | B | A | A | A |
|  | A | B | A | C | A | B | A | E |
|  | C | A | B | A | G | A | B | A |
|  | A | E | A | B | A | C | A | B |
| 20 | B | A | C | A | B | A | D | A |
|  | A | B | A | D | A | B | A | C |
|  | D | A | B | A | C | A | B | A |
|  | A | C | A | B | A | F | A | B |
|  | B | A | F | A | B | A | C | A |
| 25 | A | B | A | C | A | B | A | D |
|  | C | A | B | A | D | A | B | A |
|  | A | D | A | B | A | C | A | B |
|  | B | A | C | A | B | A | E | A |
|  | A | B | A | E | A | B | A | C |
| 30 | E | A | B | A | C | A | B | A |
|  | A | C | A | B | A | D | A | B |
|  | B | A | D | A | B | A | C | A |

FIG. 4

CURRENT SOURCE ARRANGEMENT

BACKGROUND OF THE INVENTION

This invention relates to a current source arrangement comprising N (N≧1) current sources $I_p$ (p=1, ..., N) for generating N binary-weighted currents, said sources comprising $2^N-1$ substantially equal current source transistors which are arranged in a matrix comprising R rows and K columns of matrix elements each comprising M current source transistors such that $R \times K \times M = 2^N$, each current source $I_p$ comprising a plurality of $2^{p-1}$ current source transistors. The invention also relates to a digital-to-analog converter comprising such a current source arrangement.

If such a current source arrangement is used a digital-to-analog converter can be realized by applying the binary-weighted output currents via switches, controlled by the digital input code, to a summing point or by draining them to a power supply terminal. The sum current occurring at the summing point then constitutes the analog output signal corresponding to the digital input code.

An important property of such a D/A converter is the monotonicity, that is to say, the output current occurring at a given input code should be larger than or equal to the output current associated with the previous digital input code. If this is not the case, there is a monotonicity error. In D/A converters constituted by binary-weighted current sources, such monotonicity errors may easily occur, more specifically when a so-called carry bit occurs.

The monotonicity errors are caused by the inequality of the output currents of the current source transistors constituting the binary-weighted current sources. These inequalities may be caused, for example, by temperature gradients occurring across the integrated circuit.

A binary-weighted current source arrangement which reduces the detrimental effect of a linear temperature gradient across the integrated circuit on the mutual equality of the output currents of the current source transistors is known from U.S. Pat. No. 3,995,304. To this end the current source transistors are arranged in a matrix so that the distance between the current source transistors and the centre of the matrix increases as the intensity of the current source increases. However, such an arrangement of the current source transistors does not inhibit the detrimental effects of non-linear temperature gradients and gradients and variations of other physical quantities across the matrix surface area, such as doping concentration variations, oxide thickness variations and the like.

SUMMARY OF THE INVENTION

It is therefore an object of the invention to provide a current source arrangement in which the output currents of the current sources correspond more accurately to the predetermined binary-weighted values.

According to the invention, a current source arrangement of the type described in the opening paragraph is characterized in that for each current source $I_p$ for which $R \leq 2^{p-1}/M$ and $K \leq 2^{p-1}/M$ each row comprises substantially $2^{p-1}/R.M$ matrix elements and each column comprises substantially $2^{p-1}/K.M$ matrix elements of said current source with a substantially maximum possible distance between the matrix elements associated with a given current source.

The influence of all kinds of gradients and variations on the mutual ratios of the currents of the current sources are inhibited as much as possible by distributing the matrix elements associated with a current source as evenly as possible and with maximum possible mutual distances over the surface area of the integrated circuit.

Due to the greater accuracy in the binary ratio of the current sources the risk of monotonicity errors occurring is greatly reduced by using a current source arrangement according to the invention in a digital-to-analog converter.

BRIEF DESCRIPTION OF THE DRAWING

The invention will now be described in greater detail, by way of example, with reference to the accompanying drawings, in which:

FIG. 3 shows the distribution of the current source transistors over the matrix surface area in a binary-weighted current source arrangement according to the invention, and FIG. 4 is a modification of the distribution of the current source transistors shown in FIG. 3.

DESCRIPTION OF THE PREFERRED EMBODIMENTS

Figure 1A:
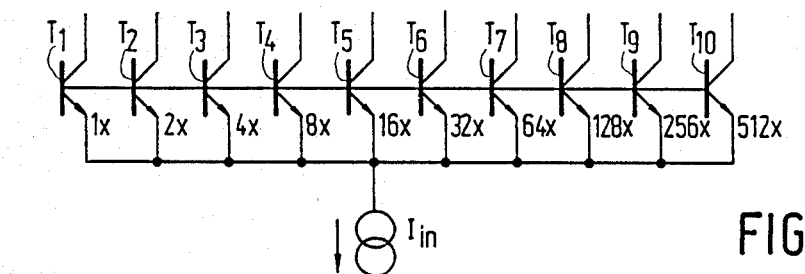
FIG. 1a is a first basic circuit diagram of a binary-weighted current source arrangement.

FIG. 1a is a first basic circuit diagram of a binary-weighted current source arrangement comprising a plurality of current sources which are shown diagrammatically by means of transistors $T_1$-$T_{10}$ whose currents are in the ratio of a binary-weighted series. To this end the transistors $T_1$-$T_{10}$ are in the form of a binary-weighted series of parallel transistors. The bases of the transistors are interconnected and the emitters are connected to a common point to which a current $I_{in}$ is applied. The collectors of the transistors $T_1$-$T_{10}$ constitute the outputs of the current source arrangement. The current $I_{in}$ is distributed over the transistors $T_1$-$T_{10}$ in the ratio of their emitter surfaces so that the collector currents of the transistors $T_1$-$T_{10}$ are in the ratio of a binary-weighted series of currents I, 2I, ... 256I, 512I.

Figure 1B:
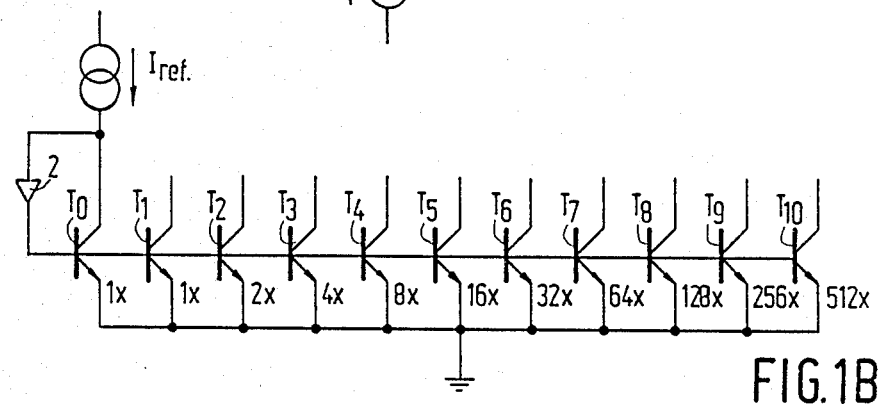
FIG. 1b is a second basic circuit diagram of a binary-weighted current source arrangement.

FIG. 1b is a second basic circuit diagram of a binary-weighted current source arrangement in which the same components have the same reference numerals. The bases of the transistors $T_1$-$T_{10}$ convey a fixed voltage which can be generated, for example, by means of a transistor $T_0$, whose base-emitter junction is arranged parallel to that of the transistors $T_1$-$T_{10}$. The collector of transistor $T_0$ is fed back to its base by means of an amplifier 2 and is further connected to a reference current source $I_{ref}$. The amplifier 2 controls the base of transistor $T_0$ in such a way that the collector current of transistor $T_0$ is accurately equal to the current $I_{ref}$. The collector currents of the transistors $T_1$-$T_{10}$ are again in the ratio of a binary-weighted series, with each of these currents being a multiple of the current $I_{ref}$ through transistor $T_0$.

Figure 2:
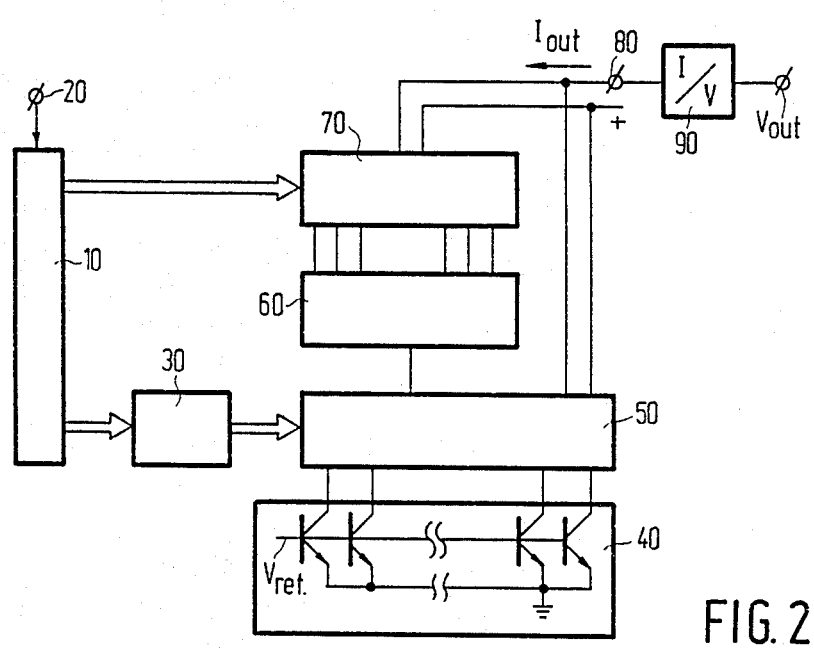
FIG. 2 is a circuit diagram of an embodiment of a digital-to-analog converter comprising a binary-weighted current source arrangement.

FIG. 2 shows an embodiment of a digital-to-analog converter comprising a current source arrangement shown in FIG. 1a. This is a 16-bit D/A converter. The currents for the 6 most significant bits are supplied by a current source arrangement 40 supplying 64 substantially equal currents. The arrangement 40 is constituted, for example, by 64 parallel-arranged and substantially equal transistors whose common base conveys a fixed voltage. Dependent on the digital input code, 63 currents are applied either to the summing point 80 or drained to the positive power supply terminal by means of a switching network 50 which is constituted by 64 three-way switches which are not shown for the sake of simplicity. Such a 3-way switch is known, for example, from ISSCC 1985 Digest of Technical Papers, pp. 32-33. One of the 64 currents is applied to the current source arrangement 60 shown diagrammatically and formed in the same way as the arrangement of FIG. 1a. The current source arrangement 60 supplies the currents for the 10 least significant bits which, dependent on the digital input code, are applied either to the summing point 80 or drained to the positive power supply terminal by means of a switching network 70 constituted by two-way switches, not shown for the sake of simplicity. The total output current $I_{out}$ occurring at the summing point 80 can be converted into an output voltage $V_{out}$ by means of a current-voltage converter 90 shown diagrammatically.

In this embodiment the 16-bit digital input word is serially applied to an input 20 of a data register 10. The 10 least significant bits directly control the switches of the switching network 70. The 6 most significant bits are firstly applied to a decoder 30 which derives the switching signals for the 64 switches of the switching network 50. The current which is applied to the current source arrangement 60 is then each time selected in such a way that it succeeds the currents which are applied to the summing point 80. The other currents are drained to the positive power supply voltage. The occurrence of monotonicity errors is prevented by this way of selecting the current applied to current source arrangement 60. In fact, the mutual deviation of the current sources of arrangement 40 increases as these current sources are located further apart on the integrated circuit. If a fixed current is applied to current source arrangement 60, the difference between this current and the current of a current source located at a further distance may exceed the current of the least significant bit of the D/A converter, which gives rise to monotonicity errors.

It is to be noted that a digital-to-analog converter may of course also be realized exclusively with a binary current source arrangement instead of with a linear current source arrangement for the most significant bits and a binary current source arrangement for the least significant bits.

The ratio between the output currents of a binary current source arrangement should often be accurately equal to the predetermined ratio. When using a binary current source arrangement in a digital-to-analog converter as is shown in FIG. 2, the difference between a given bit current and the sum of all less significant bit currents should be positive because otherwise a monotonicity error occurs. Such errors predominantly occur if a given bit current is switched on and if all less significant bit currents are switched off. Such errors are caused by the inequality of the currents of current source transistors of current source arrangement 60, which inequality is in its turn caused by the occurrence of all kinds of gradients and variations such as temperature gradients, doping concentration gradients, oxide thickness gradients and misalignment of masks. According to the invention, the influence of these perturbations on the mutual ratio of the binary-weighted currents can be reduced by arranging the current source transistors in a matrix in a given way.

Its principle is explained with reference to FIG. 3 in which a very suitable arrangement of the current source transistors in a matrix is shown for a current source arrangement comprising N=10 current sources $I_p(p \geq 1,2,\ldots,N=10)$ $I_1, I_2, \ldots, I_{10}$ supplying N=10 binary-weighted currents $I.2^{p-1}(p=1,2,\ldots,N \geq 10)$: I, 2I, . . . , 256I, 512I and which are each constituted by as many (1,2,4 . . . 512) current source transistors. The current source arrangement a total of $2N=2^{10}=1024$ transistors, one transistor of which is not used. These transistors are arranged on the surface area of the integrated circuit in a matrix of R=32 rows and K=8 columns of matrix elements each comprising four M=4 separate transistors. For the sake of clarity these four (4) transistors are shown as blocks. Besides the number of binary current sources, the size of the matrix is determined by the available surface area on the integrated circuit and the complexity of the transistor connections on the circuit. For the sake of simplicity the interconnections of the transistors associated with a given current source are not shown in the Figure. In the transistor arrangement, first the transistors associated with the current source having the largest weight are arranged and subsequently those of the other current sources are arranged in their order of decreasing weight. The 512 transistors of current source $I_{10}$ are distributed over 128 matrix elements A. Each row comprises 4 elements and each column comprises 16 elements, the mutual distance between these elements A being chosen as large as possible. The 256 transistors of current source $I_9$ are distributed over 64 elements B, each row comprising 2 elements and each column comprising 8 elements. The mutual distance between the elements B is chosen as large as possible. The 128 transistors of current source $I_8$ are distributed over 32 elements C with one element in each row and four elements in each column, the mutual distances between these elements again being chosen as large as possible. The number of matrix elements of the current sources $I_7 - I_1$ is smaller than the number of rows of the matrix so that it is not possible to arrange one element in each row for these current sources. Of these current sources the matrix elements associated with a given current source as distributed as evenly as possible over positions in the matrix which are not yet occupied, while the mutual distance between the matrix elements is again chosen as large as possible. In this case the matrix elements of the largest, still remaining current source are each time distributed first. In the Figure the matrix elements of the current sources $I_7$ to $I_3$ are denoted by DEFG and H, respectively. The current sources $I_2$ and $I_1$ comprise 2 transistors and 1 transistor, respectively, and thus cannot fill an entire matrix element each. One matrix element accommodates these transistors, together with a transistor which is not used. In the Figure this is the element in row 1-column 8 in which the transistors associated with current source $I_2$ are denoted by R, the transistor associated with current source $I_1$ is denoted by S and the transistor which is not used is denoted by S'.

As a result of the described distribution of the current source transistors, each current source is constituted by current source transistors which are distributed as evenly as possible over the surface area of the integrated circuit. Consequently, gradients and variations such as temperature gradients and doping concentration variations occurring in the arrangement are distributed as evenly as possible over each current source. The mutual ratio of the binary current sources is therefore more accurately equal to the predetermined ratio. The described arrangement of the transistors over the surface area of the integrated circuit has shown that a 10-bit binary-weighted current source arrangement can be manufactured wherein the mutual ratio of the current sources meets the predetermined ratio within an accuracy of 0.5%. This accuracy prevents the occurrence of monotonicity errors when using the arrangement in a D/A converter.

FIG. 4 shows a modification of the distribution of the current source transistors over the matrix shown in FIG. 3. The 512 transistors of current source $I_{10}$ are again distributed over 128 matrix elements A, each row and each column comprising 4 and 16 elements, respectively. The mutual distance between these elements A is again as large as possible. The 16th row is an exception in this respect, which will hereinafter be explained in greater detail. The 256 transistors of current source $I_9$ are again distributed over 64 elements B, each row comprising 2 elements and each column comprising 8 elements. The mutual distance between the elements B is then again chosen as large as possible. The 14th row is an exception. It comprises 3 elements B, which is connected with the absence of an element B in the row 16 mentioned hereinbefore. The 128 transistors of current source $I_8$ are again distributed over 32 elements C with 1 and 4 elements in each row and each column, respectively, while the mutual distance is again chosen as large as possible. Row 12 is an exception. This row accommodates two elements C, which is connected with the absence of such an element in row 16. The elements associated with current source D are arranged in the same way as in FIG. 3. The elements of the other current sources are distributed over the still remaining open positions on the matrix in a slightly different way than in FIG. 3. One matrix element, which is arranged in the first column of the 16th row in this embodiment, accommodates the transistors of the current sources $I_1$ and $I_2$, together with a transistor which is not used. This element requires at least two separate connections. To limit the complexity of the connections in this row, three out of the four elements A are arranged next to one another so that they can be easily interconnected. The properties of this current source arrangement are substantially identical to those of the arrangement shown in FIG. 3.

The invention is not limited to the embodiments shown. Generally, the distribution of the matrix elements associated with a given current source must fulfil the following conditions when using a binary-weighted current source arrangement for supplying N binary-weighted currents comprising $2^N-1$ transistors arranged in a matrix with R rows and K columns of matrix elements each comprising M current source transistors. For each current source $I_p$, for which it holds that the number of rows is $R \leq 2^{p-1}/M$ and the number of columns is $K \leq 2^{p-1}/M$ each row comprises substantially $2^{p-1}/R.M$ and each column comprises substantially $2^{p-1}/K.M$ matrix elements associated with said current source. The distance between the matrix elements of a current source in each row and each column is chosen as large as possible. When filling the matrix, first the elements of the current source having the largest weight are arranged and then those of the current sources with a decreasing weight are successively arranged. For those current sources for which a matrix element cannot be placed in each row and in each column, a matrix element is arranged each time per number of columns and per number of rows, which number increases as the number of matrix elements associated with a current source decreases. The distance between the matrix elements is again chosen as large as possible.

It will be evident that the invention can be used both for current source arrangements comprising bipolar transistors and for current source arrangements comprising unipolar transistors.

What is claimed is:

1. A current source arrangement comprising N ($N \geq 1$) current sources $I_p$ ($P=1, \ldots, N$) for generating N binary-weighted currents, said current sources comprising $2^N-1$ substantially equal current source transistors which are arranged in a matrix comprising R rows and K columns of matrix elements each comprising M current source transistors such that $R \times K \times M = 2^N$, each current source $I_p$ comprising a number of $2^{p-1}$ current source transistors, characterized in that for each current source $I_p$ for which $R \leq 2^{p-1}/M$ and $K \leq 2^{p-1}/M$, each row comprises substantailly $2^{p-1}/R.M$ matrix elements and each column comprises substantially $2^{p-1}/K.M$ matrix elements of said current source, and wherein said matrix elements are arranged to provide a substantially maximum possible distance between the matrix elements associated with a given current source.

2. A digital-to-analog converter for converting an S-bit digital input signal into an analog output signal, comprising a current source arrangement for generating N binary-weighted currents ($N \leq S$) for converting N bits of the S-bit digital input signal, wherein the current source arrangement comprises N ($N>1$) current sources $I_p$ ($p=1, \ldots, N$) for generating N binary-weighted currents, said current sources comprising $2^N-1$ substantially equal current source transistors which are arranged in a matrix comprising R rows and K columns of matrix elements each comprising M current source transistors such that $R \times K \times M = 2^N$, each current source $I_p$ comprising a number of $2^{p-1}$ current source transistors, characterized in that for each current source $I_p$ for which $R \leq 2^{p-1}/M$ and $K \leq 2^{p-1}/M$, each row comprises substantially $2^{p-1}/R.M$ matrix elements and each column comprises substantially $2^{p-1}/K.M$ matrix elements of said current source, and wherein said matrix elements are arranged to provide a substantially maximum possible distance between the matrix elements associated with a given current source.

3. A digital/analog converter as claimed in claim 2 further comprising:
   input means for receiving a digital input signal to be converted into an analog output signal,
   a digital data storage device coupled to said input means, and
   a switching network controlled by said data storage device and coupled between said current source arrangement and an output summing terminal which develops an analog current determined at least in part by said digital input signal.

* * * * *